United States Patent
Wang

(10) Patent No.: US 8,415,721 B2
(45) Date of Patent: Apr. 9, 2013

(54) FIELD SIDE SUB-BITLINE NOR FLASH ARRAY AND METHOD OF FABRICATING THE SAME

(75) Inventor: Lee Wang, Diamond Bar, CA (US)

(73) Assignee: FlashSilicon Incorporation, Diamond Bar, CA (US)

( * ) Notice: Subject to any disclaimer, the term of this patent is extended or adjusted under 35 U.S.C. 154(b) by 0 days.

(21) Appl. No.: 13/113,886

(22) Filed: May 23, 2011

(65) Prior Publication Data

US 2012/0299079 A1      Nov. 29, 2012

(51) Int. Cl.
- *H01L 29/76* (2006.01)
- *H01L 29/94* (2006.01)
- *H01L 31/062* (2006.01)
- *H01L 31/113* (2006.01)
- *H01L 31/119* (2006.01)

(52) U.S. Cl. ............. 257/288; 257/296; 257/E21.229; 257/E21.499; 257/E21.545; 257/E21.546; 257/E21.548; 257/E21.585; 257/E21.645; 257/E21.646

(58) Field of Classification Search .......... 257/288, 257/296, 316, 321, 322, 700, E21.229, E21.499, 257/257/E21.545, E21.546, E21.548, E21.585, 257/E21.645, E21.646

See application file for complete search history.

(56) References Cited

U.S. PATENT DOCUMENTS

| | | | |
|---|---|---|---|
| 6,992,349 B2 * | 1/2006 | Lee et al. | 257/324 |
| 7,825,455 B2 * | 11/2010 | Lee et al. | 257/315 |

\* cited by examiner

*Primary Examiner* — David Nhu

(74) *Attorney, Agent, or Firm* — Muncy, Geissler, Olds & Lowe, PLLC

(57) ABSTRACT

Field Side Sub-bitline NOR-type (FSNOR) flash array and the methods of fabrication are disclosed. The field side sub-bitlines of the invention formed with the same impurity type as the memory cells' source/drain electrodes along the two sides of field trench oxide link all the source electrodes together and all the drain electrodes together, respectively, for a string of semiconductor Non-Volatile Memory (NVM) cells in a NOR-type flash array of the invention. Each field side sub-bitline is connected to a main metal bitline through a contact at its twisted point in the middle. Because there are no contacts in between the linked NVM cells' electrodes in the NOR-type flash array of the invention, the wordline pitch and the bitline pitch can be applied to the minimum geometrical feature of a specific technology node. The NOR-type flash array of the invention provides at least as high as those in the conventional NAND flash array in cell area density.

11 Claims, 13 Drawing Sheets

FIELD SIDE SUB-BITLINE NOR FLASH ARRAY AND METHOD OF FABRICATING THE SAME

BACKGROUND (a) Technical Field

This invention relates to array architecture of semiconductor Non-Volatile Memory (NVM) and the methods of fabricating the array using the conventional Complimentary-Metal-Oxide-Semiconductor (CMOS) processing technology. In particular, the innovative NOR-type NVM cell strings connect a series of semiconductor NVM cells by field side sub-bitlines. The NOR-type flash array consisting of such multi-strings has cell area density at least as high as those in the conventional NAND-type flash array. While on the benefit of increasing the cell area density, the disclosed invention preserves the typical NOR-type flash advantages over NAND-type flash on fast read/write speed and low operation voltages.

(b) Description of the Related Art

Semiconductor Non-Volatile Memory (NVM), and particularly Electrically Erasable, Programmable Read-Only Memories (EEPROM), exhibit wide spread applicability in a range of electronic equipments from computers, to telecommunication hardware, to consumer appliances. In general, EEPROM serves a niche in the NVM space as a mechanism for storing firmware and data that can be kept even with power off and can be altered as needed.

Data is stored in an EEPROM cell by modulating its threshold voltage (device on/off voltage) of the Metal-Oxide-Semiconductor Field Effect Transistor (MOSFET) through the injection of charge carriers into the charge-storage layer from the substrate of the MOSFET. For example, with respect to an N-channel MOSFET, an accumulation of electrons in the floating gate, or in a dielectric layer, or nano-crystals above the FET channel region, causes the MOSFET to exhibit a relatively high threshold voltage.

Flash EEPROM may be regarded as a specifically configured EEPROM into cell array that may be erased only on a global or sector-by-sector basis. Flash NVM arrays are also categorized as NOR flash and NAND flash according to the configurations of the memory cell connections in the flash arrays. The "NOR" flash array connects NVM cells in parallel, where all the source electrodes of the NVM cell are connected to a common ground 12 and all the drain electrodes of the NVM cells are connected to multiple bitlines, respectively. As shown the cell schematic for an "M×N" NOR flash array in FIG. 1, each wordline running in x-direction contains "M" NVM cells with their individual drain electrodes connected to "M" bitlines and each bitline running in y-direction is attached with "N" drain electrodes of the NVM cells. All the source electrodes of the NVM cells in the array are connected to a single common ground 12. When a wordline is selected the entire "M" NVM cells under the selected wordline are activated. On the other hand, the NVM cells under the unselected wordlines in the array are electrically detached from the "M" bitlines. The electrical responses at the drain electrodes of the selected "M" NVM cells can be detected through their attached "M" bitlines. Since the electrical biases and signals are directly applied to electrodes of the selected NVM cells in NOR-type flash array. In general, the read and write access speed are faster and operation voltages are lower for NOR-type flash in comparison with its counter part, NAND-type flash array.

The NAND type flash array connects the NVM cells in series. Unlike the NOR type array with the configuration of source electrode-to-source electrode connection and drain electrode-to-drain electrode connection, NAND type array link the drain electrode of an NVM cell to the source electrode of its next neighboring cell. Usually, the numbers of NVM cells linked in one single NAND string are from 8 cells to 32 cells depending on the generations of the process technology nodes. In FIG. 2 the schematic for an "M×N" NAND flash array, the array contains "M" NAND cell strings and each NAND cell string contains "p" NVM cells (p=8~32) and one selection gate to connect the string to the main bitline. Each bitline has "q" NAND strings attached. Thus the total NVM cells attached to a single main bitline is p*q=N for an "M×N" NAND array. Since the source electrode and the drain electrode of NVM cells are overlapped each others in the NAND cell string the NVM cells have no contacts in between the linked NVM cells except one contact 11 placed at the end of the cell string for connecting the NAND string to the main bitline. Usually, a single main bitline connects several NAND strings in y-direction and common source lines 12 run in x-direction in the NAND flash array. In contrast, each NVM cell in NOR-type array does have one contact 11 for connecting a single cell's drain electrode to the main bitline. A NOR-type flash array is equivalently to a NAND-type array with p=1. Typically, the NOR-type NVM cell sizes including the area for a single contact 11 in a NOR flash array are 9~10 $F^2$ and the NAND-type NVM cell sizes without a contact area in a NAND flash array are 4~5 $F^2$, respectively, where F is minimum feature size for a process technology node. Therefore, the chip cell array areas for NAND type flash arrays are smaller than the NOR type flash arrays (~40% to ~50% smaller) for the same memory size and the same process technology node. In term, the smaller cell array areas for NAND flash have the advantage of lower manufacturing cost for the same bit storage capacity.

On the other hand, to access a NAND flash cell in a NAND string requires sufficient high voltage applied to the control gates of the unselected NVM cells for passing the electrical biases to the source electrode and drain electrode of the selected NVM cell. The access time including the time required for charging the unselected gates to a sufficient high voltage to turn on the NVM cells for passing electrical biases in the NAND string is long, typically, several tens of microseconds compared with a typical NOR flash access time of several tens of nanoseconds. For random read access, NOR flash is several hundred times faster than NAND flash.

For the programming methods, NOR flash usually applies Hot Carrier Injection (HCI) and NAND flash usually applies Fowler-Nordheim (F/N) tunneling, respectively. The F/N tunneling requires higher applied voltages and longer pulse duration to gain the same amount of threshold voltage shifts for semiconductor NVM cells in comparison with HCI. Typically, the voltages for F/N tunneling are from 17V to 22V with pulse durations of hundreds of µs to tens of ms versus from 3V to 10V with pulse durations of hundreds of ns to tens of µs for HCI. Therefore, the program efficiency per pulse shot for NOR flash is much higher than NAND flash.

In this invention, we disclose an innovative NOR-type flash array by applying field side sub-bitlines for connecting the NVM cells into an NOR-type cell string. While having higher performance on read/write speed and low operation voltages, the new NOR flash arrays have a compatible cell area density as those in NAND flash array. The methods of fabricating the new type of Field Side sub-bitline NOR (FSNOR) flash using the conventional Metal-Oxide-Semiconductor-Field-Effect-Transistor (MOSFET) process technology are also disclosed.

BRIEF SUMMARY

FIG. 3 shows the schematic of the Field Side sub-bitline NOR (FSNOR) flash for an "M×N" array. In the flash array, the control gates of NVM cells form "N" wordlines running in x-direction according to the minimum control gate pitch of a specific process technology and first metal bitlines form "M" main bitlines running in y-direction according to the minimum first metal line pitch of a specific process technology. As shown in FIG. 3, each field side sub-bitline 32 links "2p" source/drain electrodes of NVM cells and a contact 31 connected to the main bitline is located at the twisted point of the sub-bitline 32 in the middle. Field side sub-bitlines 32 are terminated at the both ends and only make a single contact 31 at the twisted point. Each main bitline can connect "q" field side sub-bitlines 32. Since two neighboring sub-bitlines 32 are staggered each other along one single main bitline at the middle point, each wordline crossing over each main bitline contains both source electrode and drain electrode of the two neighboring NVM cells. Therefore, for the "M×N" FSNOR array, the number "N" of NVM cells in one column with the number "q" of "2p-subbitline" equals to "p times q" (N=p*q).

For cross section views of Field Side Sub-bitline NOR (FSNOR) shown in FIGS. 4A and 4B, the active surfaces on a P-type silicon substrate 401 and N-type silicon substrate 421 are respectively separated by trench isolation 403 filled with field oxide. Referring to FIG. 4A, the N-type diffusion source/drain electrodes 402 form in the active surfaces of P-type silicon substrate 401 for N-type cell devices, along the two side walls of field trenches 403. Referring to FIG. 4B, the P-type diffusion source/drain electrodes 422 form in the active surfaces of N-type silicon substrate 421 for P-type cell devices, along the two side walls of field trenches 403. The channel regions 405 of NVM cells are formed on the active surfaces between cells' source electrodes and drain electrodes under the control gates (wordlines) 406 running in x-direction. Accordingly the channel length and width of the NVM cells in the FSNOR flash array are the width of the active silicon areas and the width of the control gate 406, respectively. In contrast, the channel length and width of NVM cells in the conventional NOR and NAND flash arrays are the width of control gate and the width of active silicon area, respectively. A tunneling dielectric 407 is on the top of the active silicon substrate surface with a storing material 408 deposited on top of the tunnel dielectric 407. The storing material 408 can be a layer of poly-crystalline, or silicon nitride film, or nano-crystal grains. The cell control gates 406 are formed on top of a coupling dielectric film 410 above the storing material 408. The composite film stack for the NVM cells is silicon substrate-tunneling dielectric-storing material-coupling dielectric-control gate material as illustrated in FIGS. 4A and 4B.

The field side sub-bitlines 32 are formed by using the same type of impurity as the source/drain diffusion electrodes linking the source/drain electrodes of NVM cells along two sides of the trench walls (see FIGS. 4A and 4B). The junction depths of diffusion sub-bitlines 32 (equivalent to the junction depths of the N-type diffusion source/drain electrodes 402 in FIG. 4A and the junction depths of the P-type diffusion source/drain electrodes 422 in FIG. 4B, respectively) are above the bottom of trench isolation 403 such that the two neighboring sub-bitlines 32 along the two sides of trench walls are electrically isolated one from another. On the top view of FIG. 5, the diffusion sub-bitlines 32 run along the sides of trench walls 403. The staggered sub-bitline structures consists of one side of sub-bitline terminated at the end by field oxide in a diagonal shape of trench and the neighboring side of the sub-bitline crossing over to the other side of trench wall at the twisted point in the middle. Meanwhile at the twisted point in the middle of the sub-bitline 32, an electrical contact 31 is placed to link the sub-bitline 32 to the main metal bitline.

BRIEF DESCRIPTION OF THE DRAWINGS

For a better understanding of the present invention and to show how it may be carried into effect, reference will now be made to the following drawings, which show the preferred embodiments of the present invention, in which.

DETAILED DESCRIPTION

The Field Side Sub-bitline NOR (FSNOR) flash arrays have the same cell array area as those in the NAND-type flash for a specific technology nodes, while preserving the advantages of read/write speed and low operation voltages. Those of ordinary skill in the art will immediately realize that the embodiments of the present invention described herein in the context of schematics and fabrication methods are illustrative only and are not intended to be in any way limiting. Other embodiments of the present invention will readily suggest themselves to such skilled persons having the benefits of this disclosure.

For illustration purpose, we shall apply N-type NVM cells to demonstrate the fabrication of FSNOR flash arrays. However, the field side sub-bitline NVM cell architectures are not limited to N-type NVM cells. The NVM cell size in the array demonstrated is determined by Control-Gate pitch and First-Metal line pitch according to a process technology node. The minimum feature size of a process technology node is defined by F. The Control-Gate pitch and First-Metal pitch can be 2F for a specific technology node. Thus, the cell feature size for a FSNOR flash array can be ~$4F^2$ in contrast to conventional NOR cell feature sizes between 9~$10F^2$.

Figure 1:
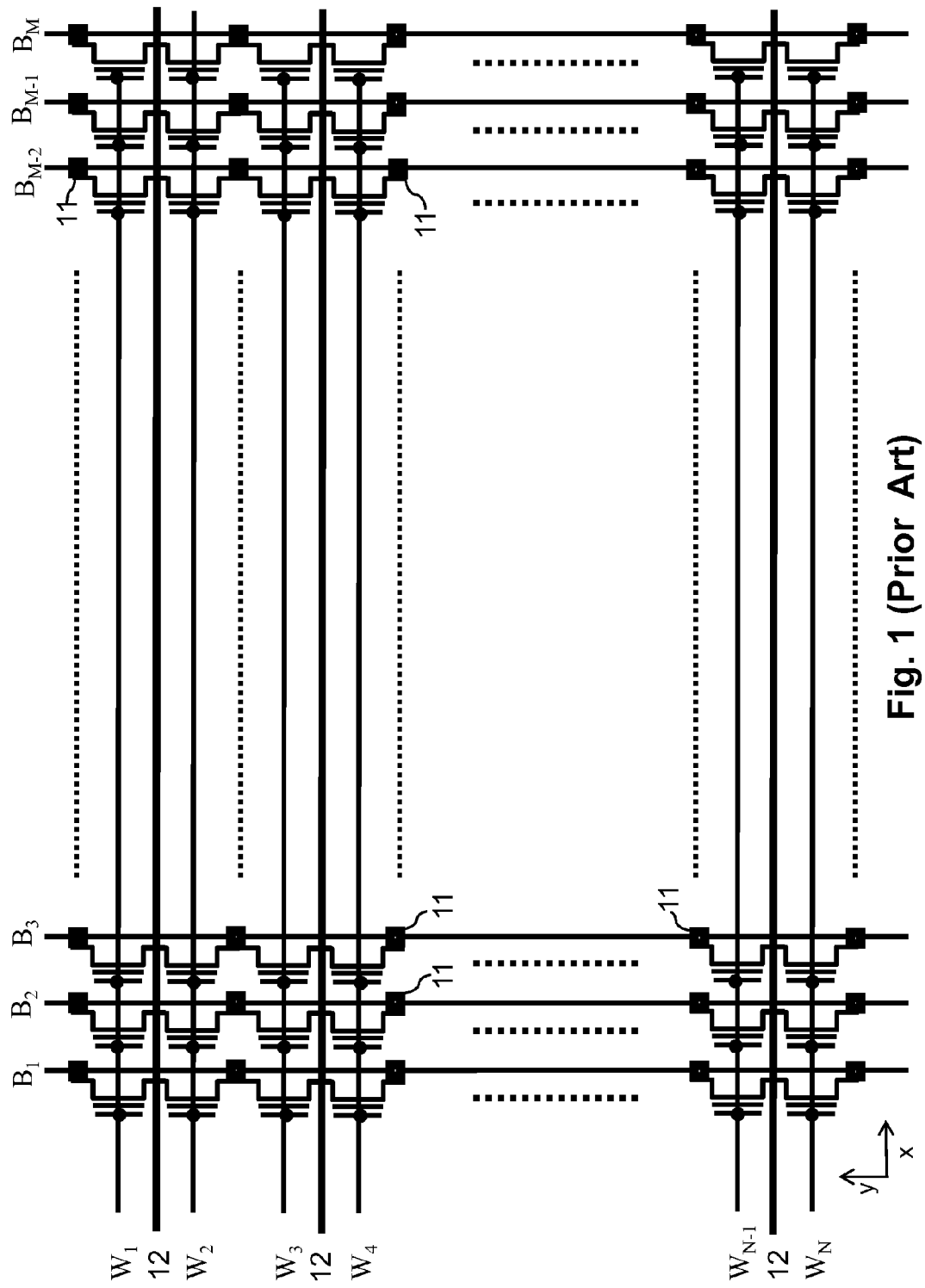
FIG. 1 shows a typical schematic for a conventional NOR-type flash array.
Figure 2:
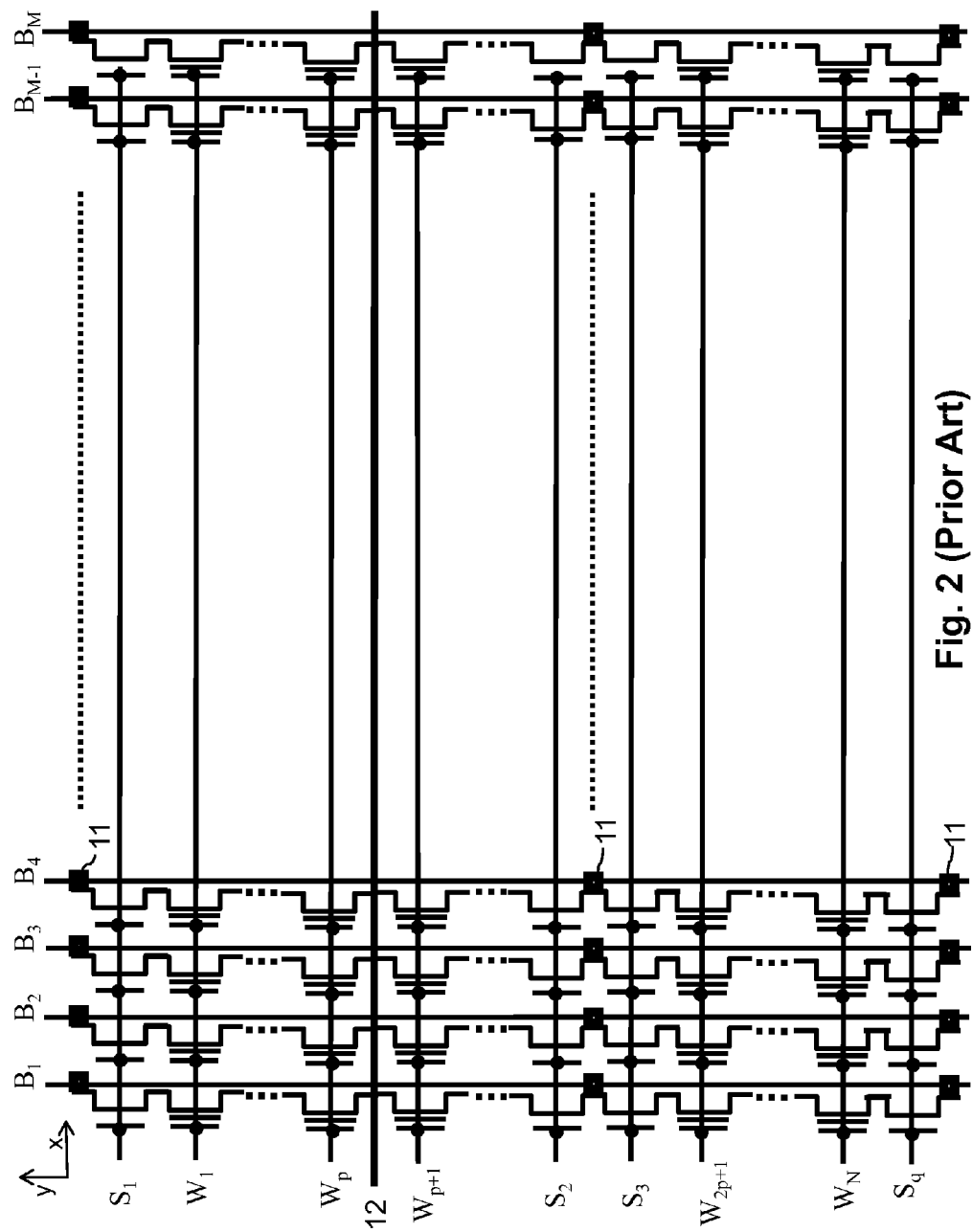
FIG. 2 shows a typical schematic for a conventional NAND type flash array.
Figure 3:
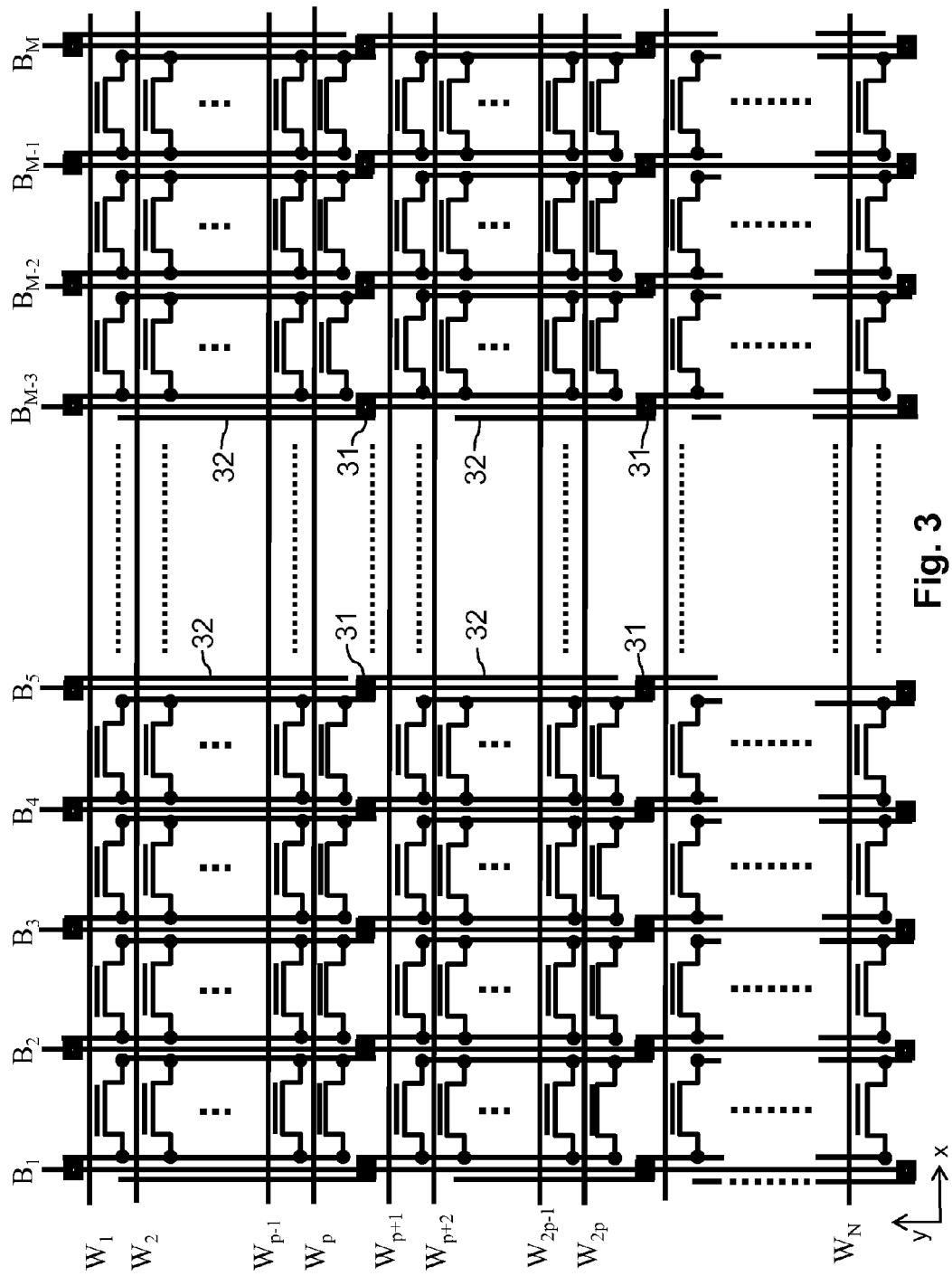
FIG. 3 shows the schematic of Field Side Sub-bitline NOR (FSNOR) flash array of the present invention.
Figure 4:
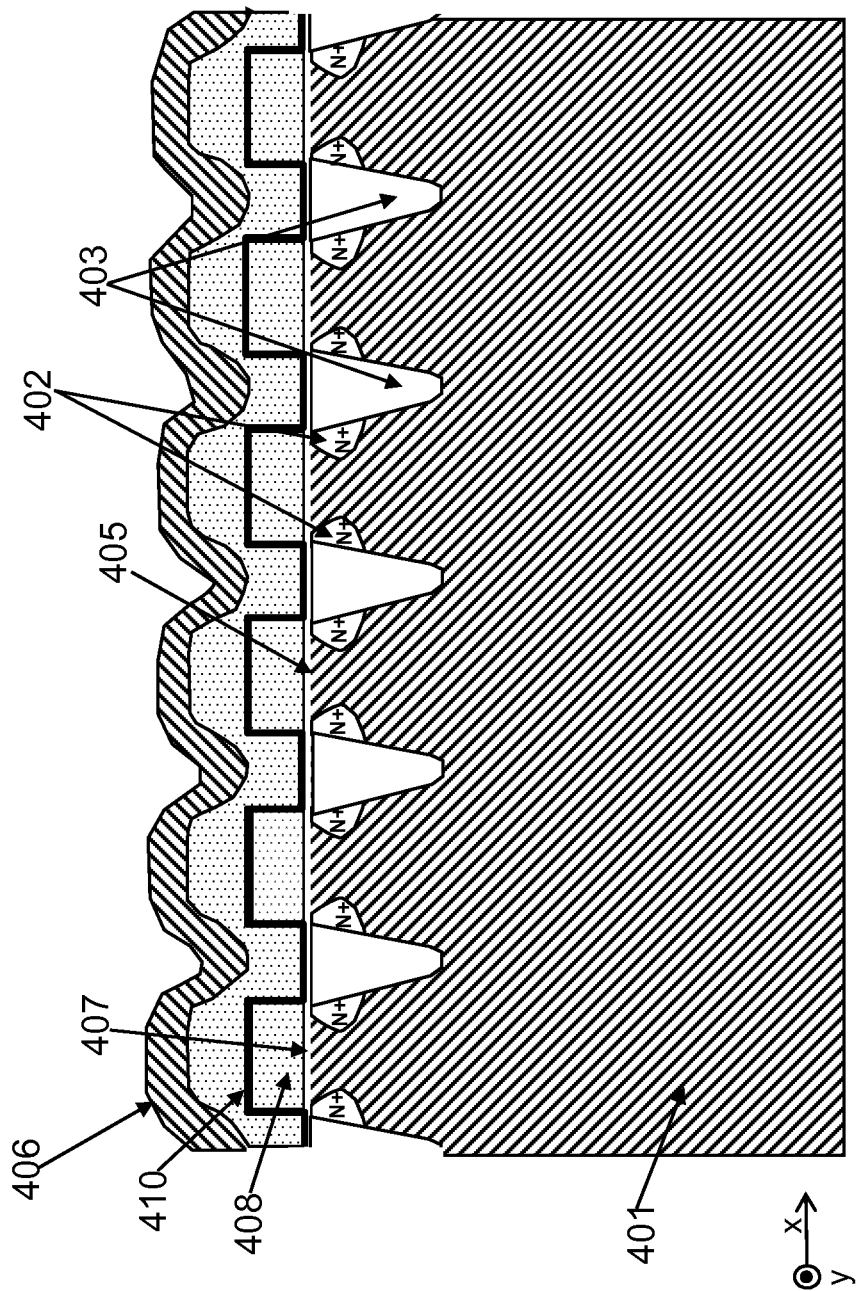
FIGS. 4A and 4B show cross section views of a portion of N-type and P-type FSNOR flash arrays according to the present invention.
Figure 4:
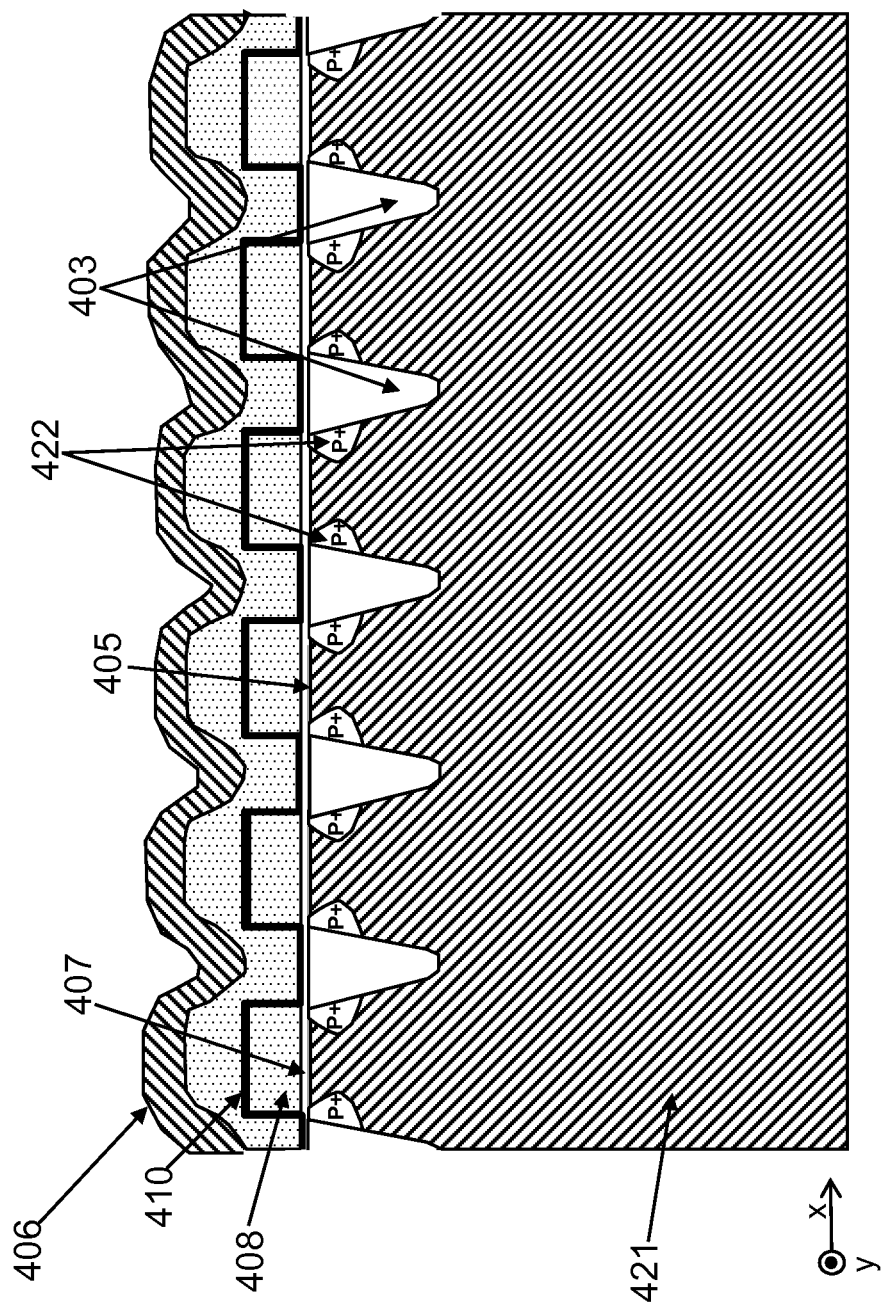
Figure 5:
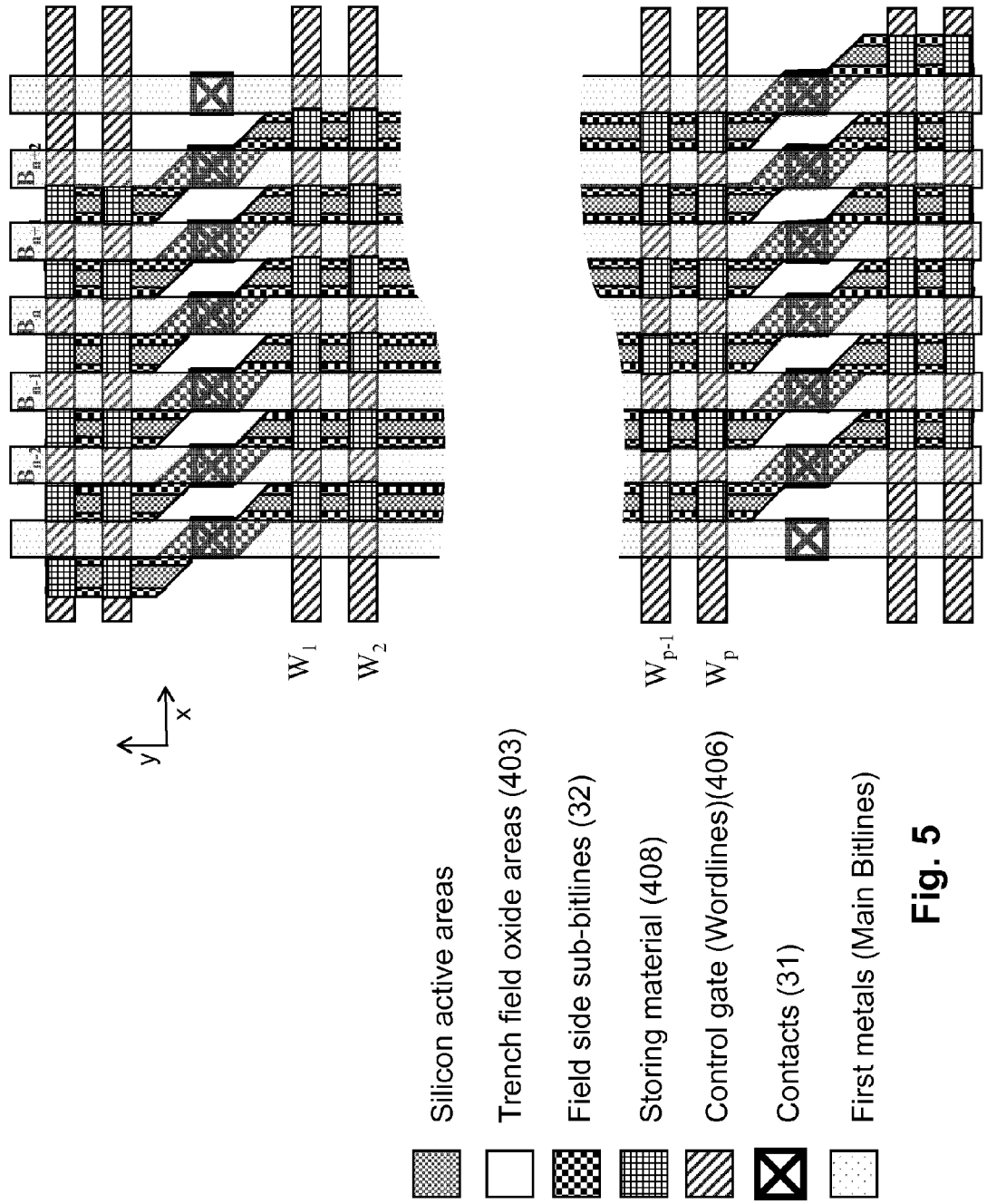
FIG. 5 shows a top view of a portion of the FSNOR flash array of FIG. 3.

As the FSNOR flash array schematic shown in FIG. 3, the sub-bitlines are indicated by reference numeral 32. The field side sub-bitlines 32 are formed by using the same type of impurity as the source and drain diffusion electrodes of NVM cells linking altogether along the two sides of the shallow trench walls, respectively. Each filed side sub-bitline 32 is terminated at its two ends and connected to the main bitline with a contact 31 at its middle point. The junction depth of diffusion sub-bitlines 32 are required to be above the bottom of trench isolation 403 such that the two sub-bitlines 32 along the two sides of trench walls 403 are electrically isolated one from the other.

Figure 6A:
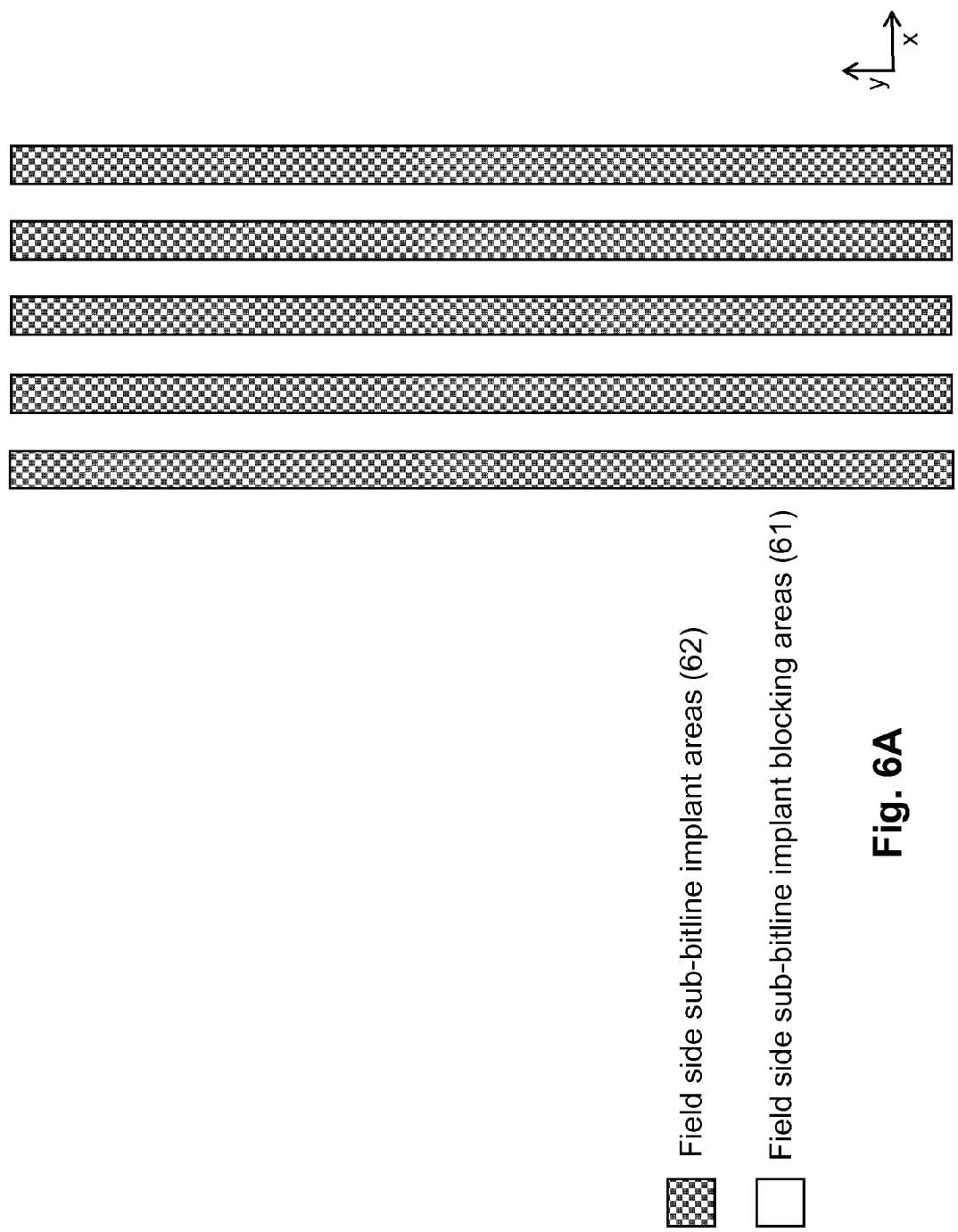
FIG. 6A shows a mask view of sub-bitline implant areas and implant blocking areas according to the present invention.
Figure 6:
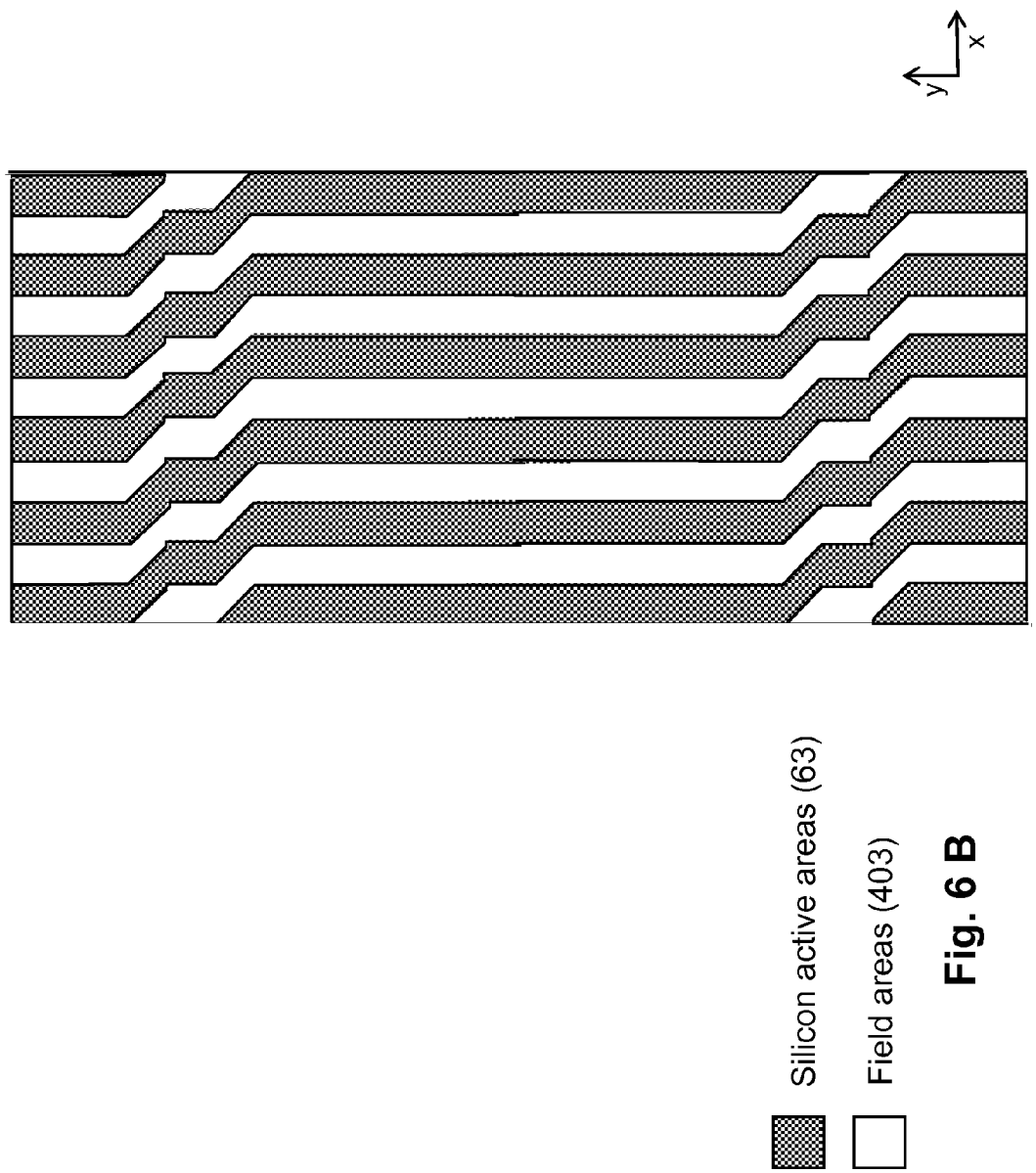
FIG. 6B shows a mask view of active areas and field areas according to the present invention.
FIG. 6C shows an overlapped view of sub-bitline implant areas and cell array active/field areas according to the invention.
Figure 6:
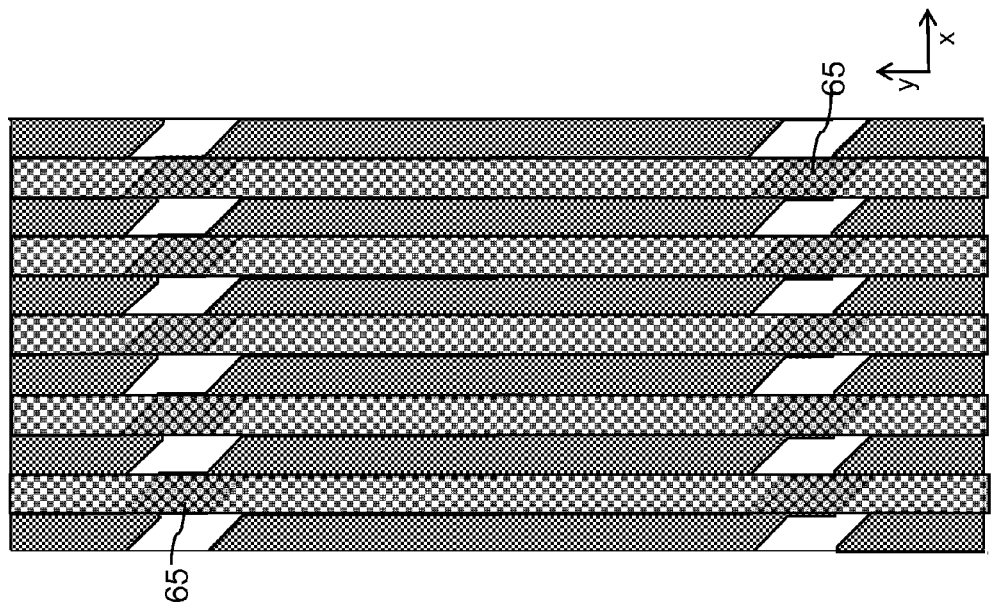
Figure 7:
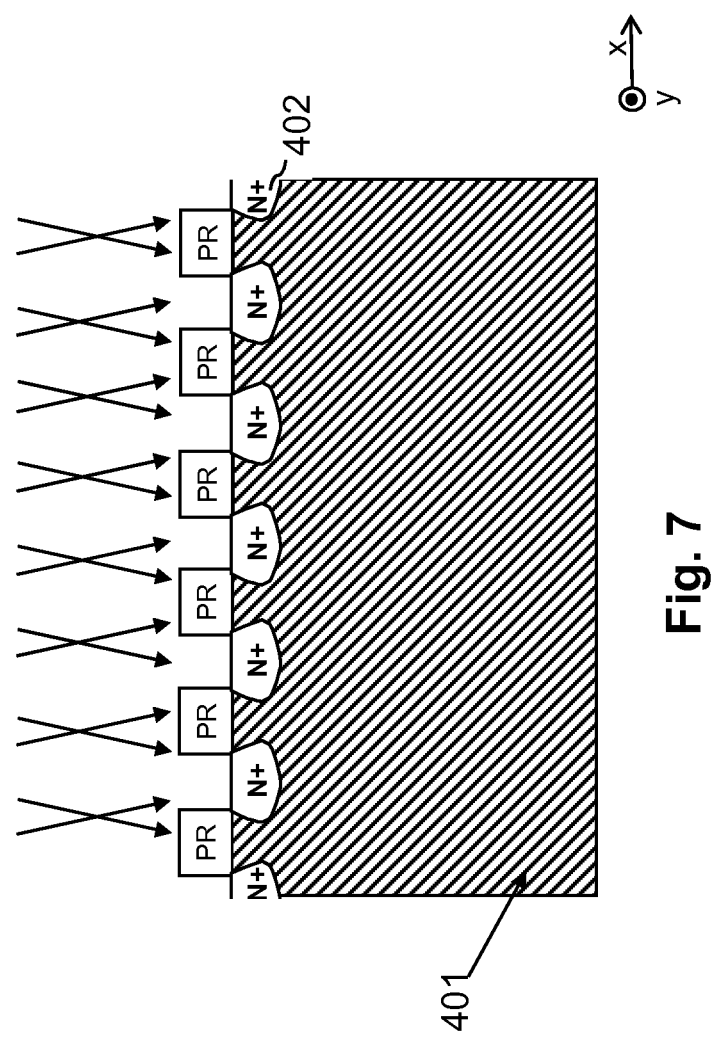
FIG. 7 shows a process flow module for forming N-type field side sub-bitlines in P-type substrate according to one embodiment of the invention.

For forming N-type sub-bitline NVM devices as illustrated in FIG. 7, cell well implants including deep N-type well isolation, P-type field and punch through implants are performed in the cell array area on P-type bare silicon substrates 401. A sub-bitline photo mask 61 in FIG. 6A is applied to perform the cell source/drain-sub-bitline, and source/drain pocket implants. Heavy ion species with low thermal diffusivities in silicon such as arsenic and indium are the preferred choices for implanting into the diamond-pattern areas 62 in FIG. 6A. The energies, dosages, and incident angles for both implants are optimized to obtain high device punch-through, high programming efficiency, and low sub-bitline resistivity for the NVM cell devices. Then the silicon wafer proceeds to form trench isolation, where a trench etch process etches through the implanted areas 62 resulting in a single joined sub-bitline into two separated sub-bitlines 32.

Figure 8:
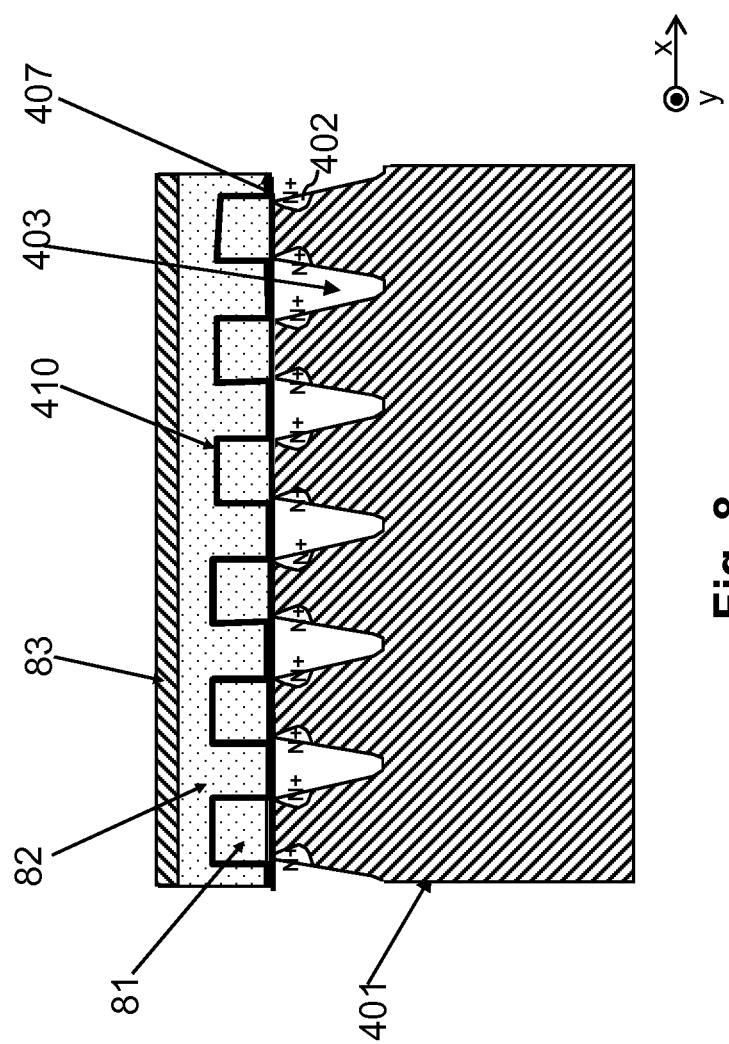
FIG. 8 shows a cross section view of snap shot after processing using poly-silicon as the storing material (floating gate) according to an embodiment of the invention.

In one embodiment for floating gate NVM device using poly-silicon as the storing material, a Self-Aligned Shallow Trench Isolation (SASTI) process is performed as the followings (FIG. 8): (1) Tunneling oxide 407 is thermally grown on the silicon substrate 401. (2) A first poly-silicon film 81 and nitride hard mask film (not shown) are deposited on the silicon wafer. (3) The nitride hard mask is patterned and etched according to the active areas 63 as shown in FIG. 6B. Nitride hard mask covers only the active areas 63. FIG. 6C shows an overlapped view of sub-bitline implant areas 62, the active areas 63 and field areas 403. Here, the sub-bitline implant areas 62 and the active areas 63 are overlapped in regions 65. (4) The cell trench etch process is performed. The etch sequence etches through the first poly-silicon film 81 and tunneling oxide 407 to a depth of trenches 403 on the silicon substrate 401 such that the trench depth is deeper than the junction depth of the sub-bitlines 32. Each implanted strip 62 selectively remains unetched in a plurality of contact landing regions 65 on the substrate surface. It is clearly illustrated in FIG. 6B that the trenches (i.e. field areas) 403 are arranged in a pattern that shifts a fraction of one column pitch in x-direction along the memory array. (5) NVM cell coupling dielectric stack 410 is deposited after the peripheral MOSFET well implantation and before the peripheral MOSFET gate oxide growth. (6) A second ploy-silicon film 82 deposited on top of the coupling dielectric 410 is patterned and etched to form the control gates 406 of NVM devices (wordlines in the NVM array). (7) Metal contacts and lines are placed at the electrical contact 31 (i.e. at the contact landing regions 65) and column line locations in the memory array in the conventional backend metallization process.

The processes for forming peripheral MOSFETs are known in the modern CMOS fabrication technology. We shall not go to the details but for the completion purpose we shall summarize the process steps as the followings: (1) N-type MOSFET well formation and P-type MOSFET well formation by ion implantation. (2) MOSFET gate oxide growths (thick and thin). (3) Second poly-silicon gate deposition. (4) The formations of cell control gates and peripheral MOSFET gates by photo masks and etching process. (5) MOSFET Lightly Doped Drain (LDD) and packet by ion implantations. (6) MOSFET spacer formation. (7) N-type and P-type MOSFET source/drain formation by implantations. (8) Impurity activation anneals. (9) Self-aligned silicide (Salicide) formation 83. The frontend process technology has completed the peripheral MOSFET devices and NVM cell devices.

NVM cell devices in arrays and MOSFET devices in circuitry are connected by conducting material inside the isolated dielectric films using the backend process technology. The backend process technology includes the process for making conducting material in contact and via holes in Inter-Dielectric Layer (IDL), and metal lines in Inter-Metal Layer (IMD)(hereinafter called "backend metallization"). Thus, a plurality of electrical contacts 31 are formed at the twisted points of the sub-bitlines 32 in the middle and a conductive material is deposited in regions of main bitlines.

Figure 9:
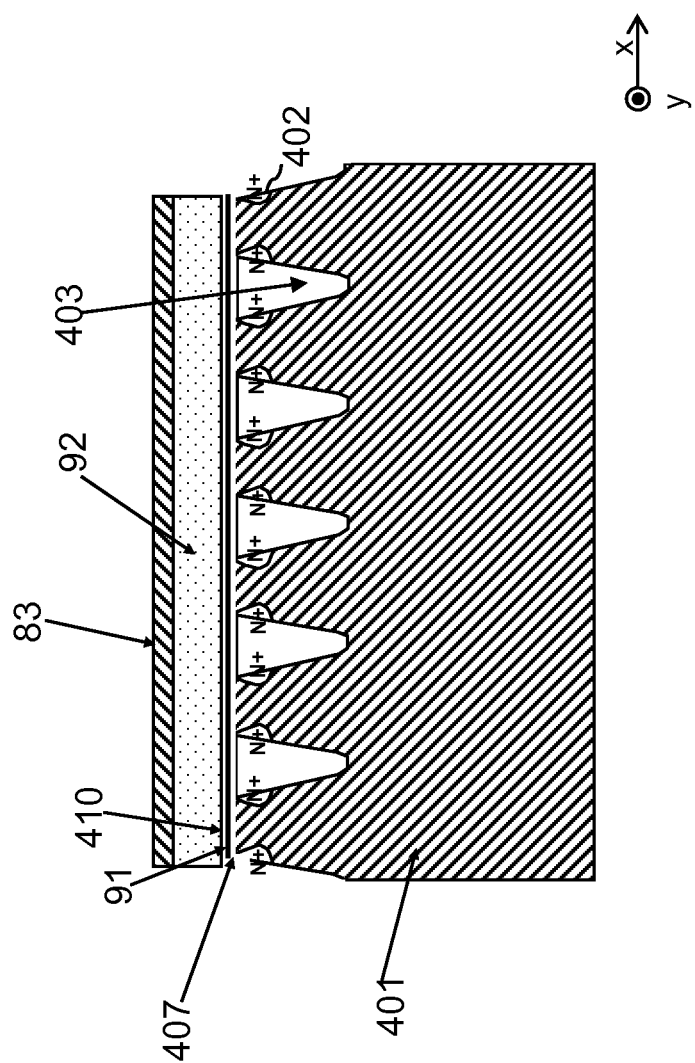
FIG. 9 shows a cross section view of a snap shot after processing for stacked nitride film as the storing material according to another embodiment of the invention.

In one embodiment a cross section view of the nitride NVM devices using nitride film as the storing material are shown in FIG. 9. After cell array well formation and sub-bitline source/drain formation described in FIG. 7, the sequential process procedures are as the followings: (1) A hard mask film (not shown) is deposited on the silicon wafer. The hard mask is then patterned and etched according to the active areas 63 as shown in FIG. 6B. The hard mask covers only the active areas 63. (2) Trench processes including active area patterned, etch, field oxide fill, and CMP are performed. The silicon substrate 401 is etched to a depth of trenches 403 by the etch sequence such that the trench depth is deeper than the junction depth of the sub-bitlines 32. Each implanted strip 62 selectively remains unetched in a plurality of contact landing regions 65 on the substrate surface. It is clearly illustrated in FIG. 6B that the trenches (i.e. field areas) 403 are arranged in a pattern that shifts a fraction of one column pitch in x-direction along the memory array. (3) Several ion implantations are performed to form various wells for peripheral MOSFETs. (4) A tunneling oxide 407 is grown on silicon substrate 401 and the nitride based stacked film 91 is deposited on top of the thermally grown oxide 407. (5) Peripheral MOSFET gate oxides are grown. (6) A poly-silicon film 92 is deposited and etched to form cell control gates and peripheral MOSFET gates, respectively. (7) MOSFET Lightly Doped Drain (LDD) implants are performed. (8) MOSFET spacer formation. (9) N-type and P-type MOSFET source/drain formations. (10) Impurity activation anneals. (11) Self-Aligned silicide (Salicide) formation 83. (12) Backend metallization, including forming a plurality of electrical contacts 31 at the twisted points of the sub-bitlines 32 in the middle (i.e. in the contact landing regions 65) and depositing a conductive material in regions of main bitlines.

Figure 10:
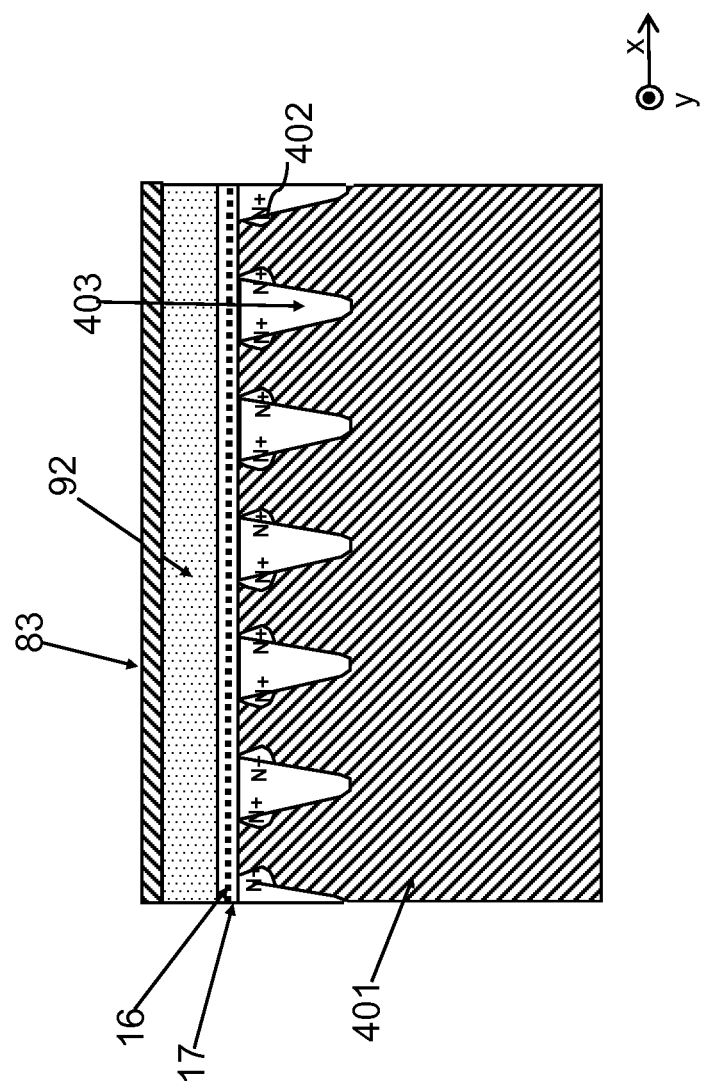
FIG. 10 shows a cross section view of a snap shot after processing for embedded nano-crystal grains as the storing material according to another embodiment of the invention.

In one embodiment the nano-crystal based NVM devices using embedded nano-crystal grains as the storing material are shown in FIG. 10. After cell array well formation and sub-bitline source/drain formation described in FIG. 7, the sequential process procedures are as the followings: (1) A hard mask film (not shown) is deposited on the silicon wafer. The hard mask is then patterned and etched according to the active areas 63 as shown in FIG. 6B. The hard mask covers only the active areas 63. (2) Trench processes including active area patterned, etch, field oxide fill, and CMP are performed. The silicon substrate 401 is etched to a depth of trenches 403 by the etch sequence such that the trench depth is deeper than the junction depth of the sub-bitlines 32. Each implanted strip 62 selectively remains unetched in a plurality of contact landing regions 65 on the substrate surface. It is clearly illustrated in FIG. 6B that the trenches (i.e. field areas) 403 are arranged in a pattern that shifts a fraction of one column pitch in x-direction along the memory array. (3) Several ion implantations are performed to form various wells for peripheral MOSFETs. (4) A tunneling oxide 17 is grown on silicon substrate 401 and nano-crystal film 16 is deposited by Chemical Vapor Deposition (CVD). Or the elements for forming nano-crystal are implanted into oxide film 17. After anneal, the nano-crystals 16 are embedded inside the oxide film 17. (5) Peripheral MOSFET gate oxides are grown. (6) A polysilicon film 92 is deposited and etched to form cell control gates and peripheral MOSFET gates, respectively. (7) MOSFET Lightly Doped Drain (LDD) implants are performed. (8) MOSFET spacer formation. (9) N-type and P-type MOSFET source/drain formations. (10) Impurity activation anneals. (11) Self-Aligned silicide (Salicide) formation 83. (12) Back-end metallization, including forming a plurality of electrical contacts 31 at the twisted points of the sub-bitlines 32 in the middle (i.e. in the contact landing regions 65) and depositing a conductive material in regions of main bitlines.

In summary, we have disclosed the innovative Field Side Sub-bitline NOR-type (FSNOR) Non-Volatile Memory (NVM) flash array and the methods of fabrication. The linked field side sub-bitline architecture is able to eliminate a cell contact as in the conventional NOR flash array. The NOR flash array of the invention has at least the equivalent cell density as the conventional NAND flash array. Meanwhile, the NOR flash array of the invention preserves the advantages over the conventional NAND flash on fast read/write speed and low operation voltages.

What is claimed is:

1. A nonvolatile memory (NVM) device comprising:
a memory cell array of NVM cells organized in rows and columns on a substrate, each cell having a charge storing material, a control gate, a first source/drain electrode and a second source/drain electrode;
a plurality of row lines, each connecting the control gates of cells in one row and running in a first direction;
a plurality of field isolations arranged in a pattern that shifts a fraction of one column pitch in the first direction along the memory cell array of NVM cells;
a plurality of column lines running in a second direction and being disposed above the row lines; and
a plurality of sub-bitlines running along two sides of field isolation walls, each sub-bitline being made up of a upper segment and a lower segment running along one side of one field isolation, the upper segment connecting the second source/drain electrodes of a first number of consecutive cells in one column, the lower segment connecting the first source/drain electrodes of a second number of consecutive cells in the adjacent column, the upper segment and the lower segment at a first layer being connected to a common column line at a second layer via one of a plurality of electrical contacts;
wherein the first number and the second number of the consecutive cells comprise no electrical contact being connected to the column lines.

2. The nonvolatile memory device according to claim 1, wherein an impurity of a conductivity type opposite to that of the substrate forms the source/drain electrodes and the sub-bitlines running in the second direction along two sides of the field isolations and crossing a plurality of silicon active regions where the electrical contacts are landed on.

3. The nonvolatile memory device according to claim 2, further comprising:
a plurality of semiconductor regions implanted by the impurity of the conductivity type extend in the second direction beyond the regions of the field isolations by a manufacturing process.

4. The nonvolatile memory device according to claim 1, wherein the field isolations are used to separate column-adjacent sub-bitline-pairs, and wherein depths of the filed isolations are deeper than junction depths of the sub-bitlines.

5. The nonvolatile memory device according to claim 1, wherein a shift of the fraction of one column pitch of the field isolation pattern in the first direction occurs at every crossing of the upper and lower segments.

6. The nonvolatile memory device according to claim 1, wherein one of two adjacent sub-bitlines laying along two sides of each common field isolation is terminated on a first side and the second sub-bitline on a second side extends across and continuously runs along the first side where a shift of the fraction of one column pitch of the field isolation pattern in the first direction occurs.

7. The nonvolatile memory device according to claim 6, wherein the second sub-bitline is connected to a corresponding column line by an electrical contact.

8. The nonvolatile memory device according to claim 1, wherein the NVM cells are substantially $4F^2$ cells where F represents the minimum feature size of a process technology node.

9. The nonvolatile memory device according to claim 1, wherein the sub-bitlines are formed by using the same conductivity type of impurity as the first source/drain electrodes and the second source/drain electrodes.

10. The nonvolatile memory device according to claim 1, wherein the charge storing material is made of one selected from the group consisting of conducting floating gate, nitride dielectric film and nano-crystal grains.

11. The nonvolatile memory device according to claim 1, which is a NOR-type flash memory device.

* * * * *